(12) United States Patent
Mumford et al.

(10) Patent No.: US 12,417,910 B2
(45) Date of Patent: Sep. 16, 2025

(54) METHOD OF REDUCING SURFACE ROUGHNESS

(71) Applicant: SPTS Technologies Limited, Newport (GB)

(72) Inventors: Roland Mumford, Newport (GB); Christopher Jonathan W. Bolton, Newport (GB)

(73) Assignee: SPTS Technologies Limited, Newport (GB)

( * ) Notice: Subject to any disclaimer, the term of this patent is extended or adjusted under 35 U.S.C. 154(b) by 484 days.

(21) Appl. No.: 17/992,238

(22) Filed: Nov. 22, 2022

(65) Prior Publication Data

US 2023/0197441 A1 Jun. 22, 2023

(30) Foreign Application Priority Data

Dec. 22, 2021 (GB) ..................................... 2118859

(51) Int. Cl.
*H01L 21/3065* (2006.01)
*H01L 21/02* (2006.01)
*H01L 21/67* (2006.01)

(52) U.S. Cl.
CPC .... *H01L 21/02274* (2013.01); *H01L 21/0234* (2013.01); *H01L 21/3065* (2013.01); *H01L 21/67063* (2013.01)

(58) Field of Classification Search
CPC ........... H01L 21/02274; H01L 21/0234; H01L 21/67063; H01L 21/67069; H01L 21/28556–28562; H01L 21/3065–30655; H01L 21/02118–0212; C23C 16/0263; C23C 16/505; C23C 16/50–517; C23C 16/45536–45542; H01J 37/321; H01J 37/32137; H01J 37/32449
See application file for complete search history.

(56) References Cited

U.S. PATENT DOCUMENTS

2004/0023508 A1* 2/2004 Chinn ............... H01L 21/30655 438/714
2021/0057227 A1* 2/2021 Itou ................... H01L 21/02076

FOREIGN PATENT DOCUMENTS

| EP | 3331000 A1 | 6/2018 |
| EP | 3415465 A1 | 12/2018 |
| JP | 2009206130 A | 9/2009 |

OTHER PUBLICATIONS

IPO, Search Report for GB2118859.4, Jun. 22, 2022.

* cited by examiner

*Primary Examiner* — Matthew C Landau
*Assistant Examiner* — Nora T. Nix
(74) *Attorney, Agent, or Firm* — Hodgson Russ LLP (57) ABSTRACT

Surface roughness on a non-planar surface of a silicon substrate with upstanding and/or recessed features can be reduced. A first sequence of plasma processing steps and a second sequence of plasma processing steps can be performed on the silicon substrate to reduce the surface roughness of the upstanding and/or recessed features while retaining these features. The first sequence of plasma processing steps includes i) a plasma deposition step using oxygen and at least one fluorocarbon gas followed by ii) a plasma etch step using oxygen, at least one fluorocarbon etchant gas, and $SF_6$. The second sequence of plasma processing steps includes i) an isotropic plasma etch step using oxygen and at least one fluorine containing etchant gas followed by ii) a plasma etch step using at least one fluorine containing or chlorine containing etchant gas.

18 Claims, 5 Drawing Sheets

METHOD OF REDUCING SURFACE ROUGHNESS

CROSS-REFERENCE TO RELATED APPLICATIONS

This application claims priority to U.K. Patent App. No. 2118859.4 filed Dec. 22, 2021, the disclosure of which is hereby incorporated by reference.

FIELD OF THE DISCLOSURE

This invention relates to method of reducing surface roughness on a non-planar surface of a silicon substrate comprising upstanding and/or recessed features The invention relates also to associated plasma processing apparatus and to silicon substrates having a surface roughness which has been reduced by these methods.

BACKGROUND OF THE DISCLOSURE

When processing semiconductor, microelectronic or optoelectronic devices at a microscopic level, it is inevitable that small imperfections will be introduced by each process step. Surface roughness of this kind can be caused by non-uniform deposition thickness across a substrate or by material being removed in openings in a mask but not being removed beneath the mask. When variations in the thickness of the processed substrate become problematic for the subsequent patterning layer, it is known to planarise the surface either by depositing a layer (e.g. Spin On Glass (SOG)) which can self-planarise the surface or by using a chemical mechanical process (CMP) to chemically etch and abrade the surface until the surface is sufficiently planar for the next process step.

These approaches perform well in planar (2D) processing as used in many current semiconductor applications. However, there are new Microelectromechanical Systems (MEMS) and other 3D micromechanical structures which have surface imperfections on non-planar surfaces. CMP or self-planarizing films are not viable options to reduce surface roughness of these types of structures without damaging the 3D structures themselves. This constitutes a serious problem.

To improve the functionality of these new devices it is important that non-planar surfaces can also be smoothed without adversely affecting the eventual device structures. Surface roughness can result in degraded optical properties, and it can adversely affect subsequent process steps such as PVD, CVD or photolithography steps, where typically a smooth surface is required.

BRIEF SUMMARY OF THE DISCLOSURE

The present invention, in at least some of its embodiments, addresses the above described problems. In at least some of its embodiments, the present invention provides a plasma based method that is capable of smoothing non-planar silicon surfaces by reducing surface roughness on upstanding and/or recessed features, whilst retaining the original topographic dimensions. This might include, but is not limited to, the smoothing of non-planar features such as microneedles, tapered vias and trenches.

According to a first aspect of the invention there is provided a method of reducing surface roughness on a non-planar surface of a silicon substrate comprising upstanding and/or recessed features, the method comprising the steps of:
  providing a silicon substrate having a non-planar surface comprising upstanding and/or recessed features which have an associated surface roughness;
  performing a first sequence of plasma processing steps on the silicon substrate; and
  performing a second sequence of plasma processing steps on the silicon substrate;
  wherein the performance of the first and second sequence of plasma processing steps reduces the surface roughness of the upstanding and/or recessed features while retaining said features; and:
  the first sequence of plasma processing steps comprises i) a plasma deposition step using oxygen and at least one fluorocarbon gas at a total process pressure of 100 mTorr or greater, with no RF bias or with an RF bias power of less than 100 W, followed by ii) a plasma etch step using oxygen, at least one fluorocarbon etchant gas, and $SF_6$ at a total process pressure of 100 mTorr or greater, with no RF bias or with an RF bias power of less than 100 W; and
  the second sequence of plasma processing steps comprises i) an isotropic plasma etch step using oxygen and at least one fluorine containing etchant gas at a total process pressure of 100 mTorr or greater, with no RF bias or with an RF bias power of less than 100 W, followed by ii) a plasma etch step using at least one fluorine containing or chlorine containing etchant gas at a total process pressure of less than 100 mTorr, with an RF bias power of greater than 500 W.

The plasma deposition step i) and plasma etch step ii) of the first sequence of plasma processing steps can be alternately repeated.

The plasma deposition step i) of the first sequence of plasma processing steps can use flows of oxygen and the at least one fluorocarbon gas which have associated flow rates, and the flow rate of oxygen can be less than the flow rate of the at least one fluorocarbon gas.

In the plasma deposition step i) of the first sequence of plasma processing steps, the at least one fluorocarbon gas can be $CF_4$.

In the plasma etch step ii) of the first sequence of plasma processing steps, the at least one fluorocarbon etchant gas can comprise $CF_4$ and/or $C_4F_8$. In the plasma etch step ii) of the first sequence of plasma processing steps can use a process gas mixture which consists essentially of oxygen, $SF_6$, $CF_4$ and $C_4F_8$.

The plasma etch step ii) of the first sequence of plasma processing steps can use flows of oxygen, $SF_6$ and the at least one fluorocarbon etchant gas which have associated flow rates, and the flow rate of oxygen can be less than the combined flow rates of $SF_6$ and the at least one fluorocarbon etchant gas.

The plasma etch steps i) and ii) of the second sequence of plasma processing steps can be alternately repeated.

In the plasma etch step i) of the second sequence of plasma processing steps, the fluorine containing etchant gas can be $SF_6$.

In the plasma etch step i) of the second sequence of plasma processing steps, the fluorine containing etchant gas can be $CF_4$.

In the plasma etch step ii) of the second sequence of plasma processing steps, $SF_6$ or $CF_4$ can be used as the fluorine containing etchant gas.

The plasma etch step ii) of the second sequence of plasma processing steps can use a Noble gas. Optionally, the Noble gas is argon. The plasma etch step ii) of the second sequence of plasma processing steps can use a process gas mixture which consists essentially of $SF_6$ and argon.

The plasma etch step i) of the second sequence of plasma processing steps can use flows of oxygen and the at least one fluorine containing etchant gas which have associated flow rates, and the flow rate of oxygen can be greater than the flow rate of the at least one fluorine containing etchant gas.

The plasma etch step ii) of the second sequence of plasma processing steps can be performed in the substantial absence of oxygen.

One or more of the plasma etch step i) of the first sequence of plasma processing steps, the plasma etch step ii) of the first sequence of plasma processing steps, and the plasma etch step i) of the second sequence of plasma processing steps can be performed at a total process pressure in the range 100 to 300 mTorr. Any combination of these plasma etch steps can be performed at a total process pressure in the range 100 to 300 mTorr. All three of these plasma etch steps can be performed at a total process pressure in the range 100 to 300 mTorr.

The plasma etch step ii) of the second sequence of plasma processing steps can be performed at a total process pressure in the range 5 to 50 mTorr.

The plasma etch step ii) of the second sequence of plasma processing steps can be performed with an RF bias power of 1500 W or less. The plasma etch step ii) of the second sequence of plasma processing steps can be performed with an RF bias power in the range 750 to 1500 W.

The step of performing a first sequence of plasma processing steps on the silicon substrate can be preceded by one or more surface treatment steps in which the non-planar surface of the silicon substrate is treated to remove one or more materials from the non-planar surface. A surface treatment step can be a cleaning step to remove one or more contaminants such as hydrocarbons and/or polymeric residues. The cleaning step can be a plasma ashing step or a wet chemical etching clean step. A plasma ashing step can be performed using an oxygen plasma. A surface treatment step can be an etch step to remove native silicon oxide from the non-planar surface. This etch step can be performed using a plasma formed in a gaseous atmosphere of Argon and one or more fluorine containing gases, for example $SF_6$, with an applied RF bias power. The etch step to remove native silicon oxide from the non-planar surface can follow the cleaning step to remove one or more contaminants. The one or more surface treatment steps can be performed in a different apparatus to the apparatus used to perform the first and second sequences of plasma processing steps.

The upstanding and/or recessed features can comprise one or more of microneedles, vias and trenches.

The upstanding and/or recessed features can have an associated height or depth of 1000 microns or less, optionally 100 microns or less, optionally 10 microns or less. However, smoothing of larger or smaller upstanding and/or recessed features which are above these upper limits or below this lower limit is also within the scope of the invention. The surface roughness on the upstanding and/or recessed features can have an associated height or depth of 0.5 micron or greater. The surface roughness on the upstanding and/or recessed features can have an associated height or depth of 10 microns or less. The surface roughness can be measured by Scanning Electron Microscopy. Alternatively, the surface roughness can be measured by Atomic Force Microscopy (AFM) or with a surface profilometer.

The silicon substrate can be a silicon wafer.

According to a second aspect of the invention there is provided a silicon substrate having a non-planar surface comprising upstanding and/or recessed features having a surface roughness which has been reduced by a method according to the first aspect of the invention.

According to a third aspect of the invention there is provided plasma processing apparatus for reducing surface roughness on a non-planar surface of a silicon substrate comprising upstanding and/or recessed features in accordance with the first aspect of the invention, the apparatus comprising:

a chamber;

a substrate support disposed in the chamber;

a plasma production device for use in performing a first and a second sequence of plasma processing steps on the silicon substrate;

a gas introduction system for introducing oxygen, at least one fluorine containing gas and, optionally, at least one chlorine containing etchant gas into the chamber; and a controller, wherein the controller is configured to control the operation of the apparatus in accordance with the first aspect of the invention.

For the avoidance of doubt, whenever reference is made herein to 'comprising' or 'including' and like terms, the invention is also understood to include more limiting terms such as 'consisting' and 'consisting essentially'.

Whilst the invention has been described above, it extends to any inventive combination of the features set out above, or in the following description, drawings or claims. For example, any features disclosed in relation to the first aspect of the invention may be combined with any features disclosed in relation to the second or third aspects of the invention and vice versa.

DESCRIPTION OF THE DRAWINGS

Embodiments of the invention will now be described, by way of example only, with reference to the accompanying drawings, in which:

FIG. 3 shows SEM (scanning electron microscope) images (a) a ridge structure and (b) the tip of the ridge structure before the start of the smoothing process;

FIG. 4 shows high resolution SEM (scanning electron microscope) images of part of the tip of the ridge structure (a) before smoothing and (b) after the smoothing process has finished.

DETAILED DESCRIPTION OF THE DISCLOSURE

Figure 1:
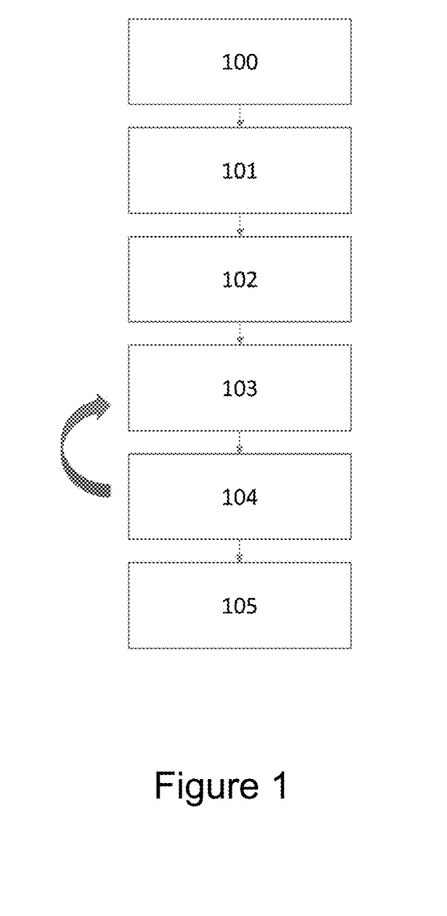
FIG. 1 is a process flow diagram showing a smoothing process of the invention.

A flow diagram showing a representative smoothing process sequence is provided in FIG. 1. In step 100 the silicon wafer is loaded into a plasma etch chamber and the chamber is evacuated and brought to process pressure. This is followed in step 101 by a surface treatment step 101a in which hydrocarbon deposits are removed through the use of an oxygen based "ashing" plasma followed by a break through etch step 101b where the thin layer of native $SiO_2$ is removed from the wafer surface. In step 102, a first high pressure polymer forming step 102a is carried out using $CF_4$ and $O_2$ and this forms a discontinuous uniform, relatively thick, layer over the wafer. This is followed by a second high pressure polymeric deposition step 102b using $CF_4$, $O_2$ and $C_4F_8$ and $SF_6$ which increases the etch rate in regions where there is no polymeric coating present while still producing a discontinuous thin polymeric deposit. The total process times of these steps will be determined by the height of the features to be removed and this can be determined using the disclosure provided herein supplemented, if necessary, by routine empirical testing. Optical methods such as microscopy with low incident lighting can be very effective in determining relative changes in the roughness of the surface. Alternatively Scanning Electron Microscopy can be used for comparative analysis. Without wishing to limited by any particular theory or conjecture, the steps in 102 are believed to perform two functions. Firstly, they are designed to rapidly destroy any regular patterns from prior processing of the wafer or sample. Secondly, they act as an initial extended smoothing step to mitigate the greatest peak to peak roughness. At this point the surface of the wafer is believed to have isolated features which have been protected by the micro-masking caused by the polymeric deposition steps and the fluorine based etch process. In steps 103 and 104 a process is employed where (in step 103) a high pressure step is used to form islands of passivation which acts as a micromask to isotropic etching of the exposed silicon, while features generated in step 103 are etched by a low pressure anisotropic etch process in step 104. The steps can be looped, i.e. alternately repeated, to progressively reduce the amounts of material being removed until the desired surface roughness is achieved. At step 105 the process is completed and the wafer can be removed from the system.

The smoothing process sequence shown in FIG. 1 can be carried out using a modified Omega™ Rapier ICP (inductively coupled plasma) etch tool system, which is commercially available from the Applicant SPTS Technologies Limited, located in Newport, South Wales, UK.

Figure 2:
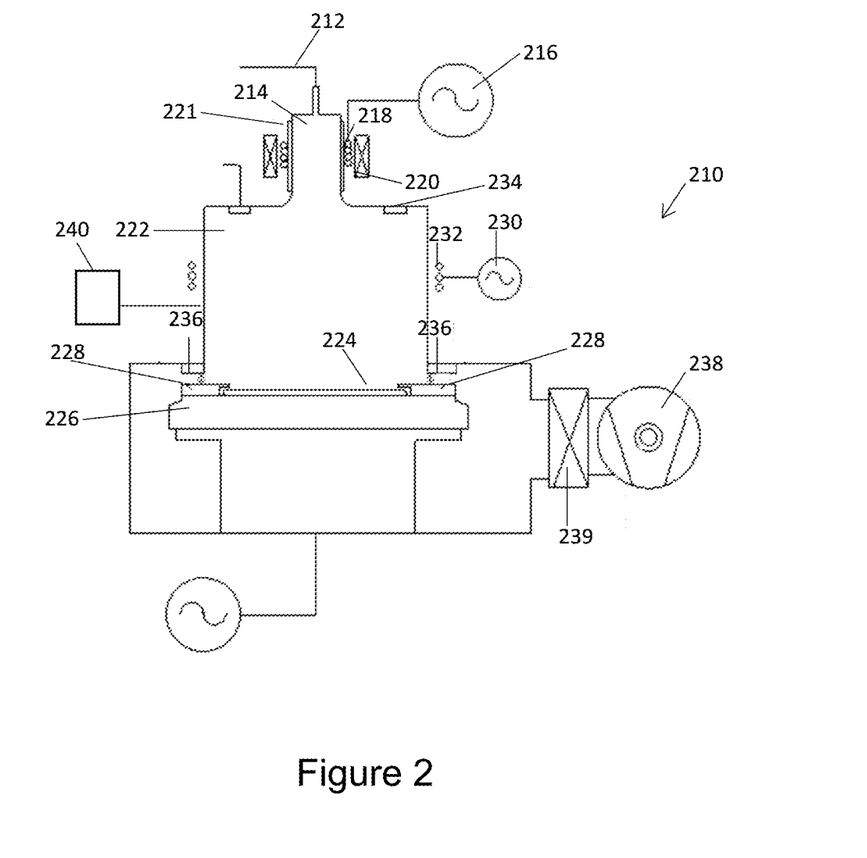
FIG. 2 is a cross-sectional semi-schematic diagram of an etch tool for performing the process flow of FIG. 1.

FIG. 2 depicts an Omega™ Rapier ICP etch tool system, shown generally at 210. The primary gas feed 212 enters the primary chamber 214 which has an associated primary RF source 216 nominally operating at 13.56 MHz. Other frequencies could in principle be used. RF is coupled into an RF antenna 218 to produce ionization in the primary chamber 214. This can be assisted by a DC 220 coil to modify the confinement of the plasma. A Faraday shield 221 can be provided between the DC coil 220 and the wall of the primary chamber 214 to reduce capacitive coupling. The plasma from the primary source enters the main chamber 222 where a wafer 224 is placed on the wafer support 226, which may be an electrostatic chuck. Optionally, the edge of the wafer 224 can be protected by a wafer edge protection (WEP) device 228 to avoid excessive loss of silicon at the wafer edge where the resist edge bead has been removed. The main (secondary) chamber 222 has a secondary RF source 230 having a secondary RF coil 232 placed around the main chamber 222 to provide a secondary plasma close to the chamber wall. The RF coil 232 could also operate at 13.56 MHz or a lower frequency such as 1-2 MHz, although other frequencies could in principle be used. It is possible to include a Faraday shield between the secondary RF coil 232 and the wall of the main chamber 222. An annular gas distribution system 234 is incorporated into the main chamber 222 to provide an independent gas source for the secondary plasma. Gas flows above the WEP 228 and below an annular baffle 236 in a radial fashion to the pump 238 through a gate valve 239. Also provided is a controller 240 which is configured to control the apparatus to perform the process sequence shown in FIG. 1. The Rapier etch tool system uses two ICP RF sources (see Table 1) to control etch uniformity. However, the process would be equally applicable to single ICP systems or to other plasma etch systems, such as TCP (transformer coupled plasma) systems, provided they are appropriately adapted to perform the process sequence of the invention.

Figure 3A:
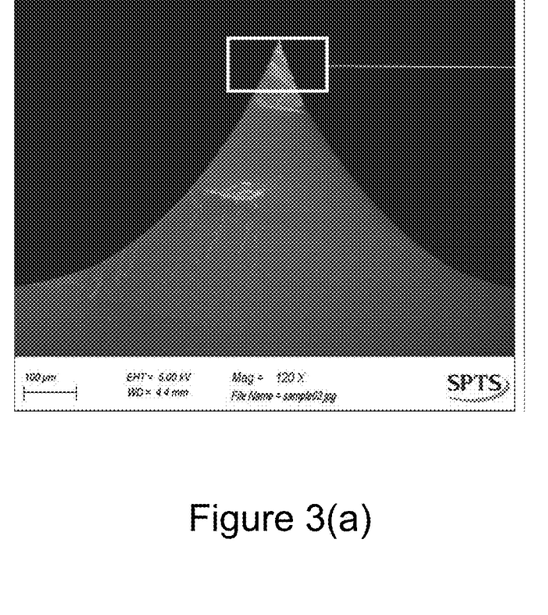
Figure 3B:
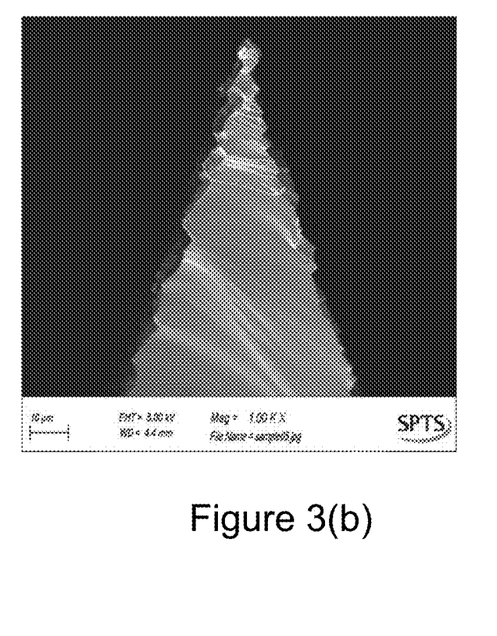

FIG. 3(a) is an SEM micrograph prior to smoothing of a plasma etched silicon ridge structure having a height of about 400 micron. The ridge structure is part of a silicon microneedle array. FIG. 3(b) is a high resolution SEM image of the tip of the feature clearly showing a relatively rough surface of about 2 to 4 microns peak to trough.

Figure 4A:
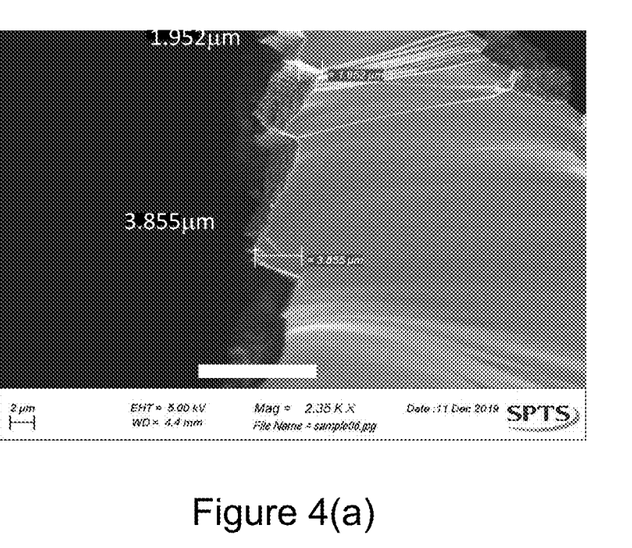
Figure 4B:
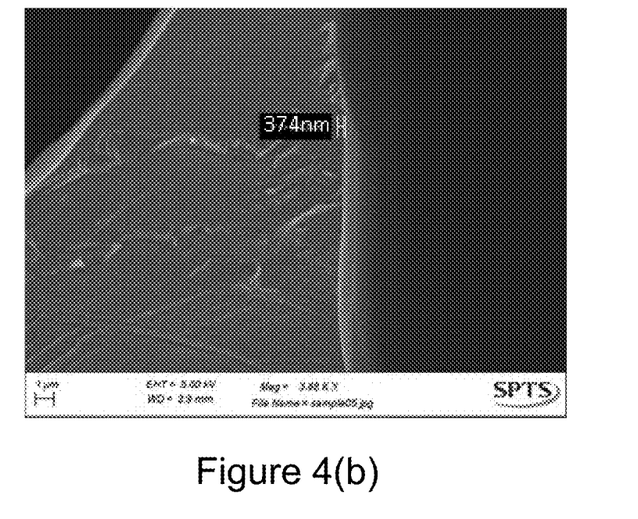
Figure 5:
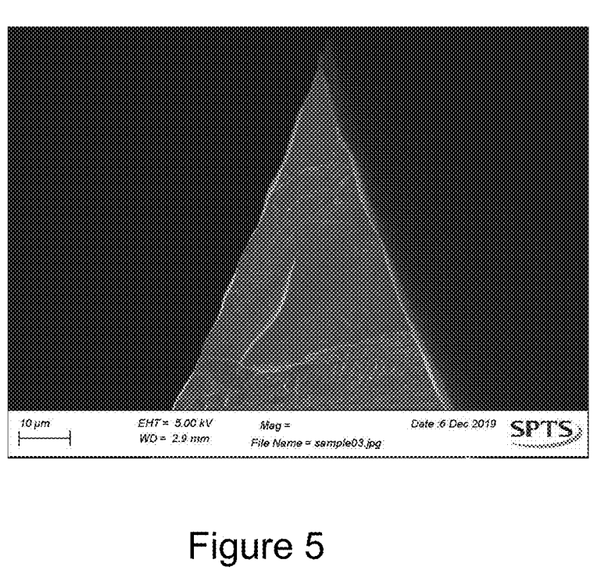
FIG. 5 is a SEM image of the tip of the ridge structure after the smoothing process has finished.

FIG. 4 shows high resolution SEMs of (a) the pre-processed and (b) post-processed ridge structure features. In FIG. 4(a) sharp features of about 2-4 microns height are observed. In FIG. 4(b) these features have been reduced to less than 0.37 microns in height after smoothing. FIG. 5 is a SEM of the tip of the post-processed ridge structure. It can be seen that the tip has retained its profile after smoothing with an acceptable level of roughness being achieved. If a higher degree of smoothing is desired, then this can be achieved in a straightforward way by implementing additional cycles of the steps 103 and 104.

TABLE 1

Typical process parameters for Si smoothing.

| STEP No | Presure (mTorr) | RF 1 (kW) | RF 2 (kW) | RF Bias (kW) | Ar (sccm) | CF4(sccm) | O2 (sccm) | C4F8 (sccm) | SF6 (sccm) |
|---|---|---|---|---|---|---|---|---|---|
| 101a | 20 | 1.5 | 0.2 | 0.2 | | | 500 | | |
| 101b | 20 | 1.5 | 1 | 0.75 | 400 | | | | 100 |
| 102a | 250 | 2 | 1 | 0 | | 120 | 30 | | |
| 102b | 250 | 2 | 1 | 0 | | 20 | 50 | 20 | 150 |
| 103 | 250 | 2.5 | 1.2 | 0 | | | 500 | | 400 |
| 104 | 20 | 1.25 | 1 | 1 | 400 | | | | 350-150 |

Table 1 provides typical (but non-limiting) parameters used to etch the Si features. Contaminants that are present on the wafer surface may need to be removed to enable the silicon etch process to work effectively. In the example provided herein, hydrocarbon polymeric residues were removed by an "ashing" $O_2$ plasma in approximately 10 s (step 101a of Table 1). The process conditions for this step can vary depending on the condition of the wafer prior to arrival at the plasma etch tool. It would be possible for this clean step to occur in another plasma system or even a wet chemical clean step. The $SiO_2$ on the surface of the silicon is then removed by step 101b in Table 1 by using Ar & $SF_6$ with an applied RF bias. The silicon surface is then exposed for the effective performance of the smoothing process 102a, 102b, 103, and 104.

Without wishing to limited by any particular theory or conjecture, the relatively high pressure process steps 102a and 102b described in Table 1 are believed to produce a relatively thick micromask (a discontinuous passivation layer) over the silicon surface while providing an isotropic etch of exposed silicon. In step 102a, the passivation growth rate/silicon etch rate ratio is higher than in step 102b. This enables the removal of relatively larger quantities of silicon for a fixed total process time. The steps 102a, 102b typically each take place over several minutes. For the particular example provided herein, the duration of the steps 102a and 102b were both 360s. The durations of these steps are proportional to the amount of material that is to be removed. The relatively high pressure C, F & O plasma in step 102a is believed to produce a polymer micromask, while F radicals and other neutrals are believed to etch the exposed silicon slowly. The addition of $C_4F_8$ and $SF_6$ in step 102b is believed to increase the isotropic silicon etch rate due to the higher density of F species in the plasma. It could be possible to loop the steps 102a and 102b to treat rough surfaces.

The looped process steps 103 and 104 provide a series of steps where the roughness of the surface is progressively reduced in a series of relatively short process steps (<60 sec). In step 103, a high pressure $O_2$, $SF_6$ chemistry is used and, without wishing to limited by any particular theory or conjecture, this is believed to produce a thin discontinuous passivation layer of a S based compound while providing an isotropic etch of the exposed silicon. In step 104, a short (about 15 s or less) low pressure, Ar, $SF_6$ process with an applied substrate bias rapidly removes the isolated features that have been produced in step 103. Excessive RF bias in step 104 can result in the ridge tip being removed. However, by judicious but routine choice of RF bias conditions this can be avoided. By progressively reducing the amount of material being removed in these steps by modifying the process conditions, the surface roughness can be reduced. Typical process variables to change are RF power and step process time, although gas compositional changes or flows could be considered. RF source and RF bias could operate in a pulsed or continuous mode.

Surface roughness was reduced by a factor of ten or greater on silicon wafers with ridge structures as shown in FIGS. 2 to 4. However, any non-vertical surface, such as tapered vias or trenches, could also be reduced in roughness using the principles described herein.

The invention claimed is:

1. A method of reducing surface roughness on a non-planar surface of a silicon substrate comprising upstanding and/or recessed features, the method comprising the steps of:
   providing a silicon substrate having a non-planar surface comprising upstanding and/or recessed features which have an associated surface roughness;
   performing a first sequence of plasma processing steps on the silicon substrate; and
   performing a second sequence of plasma processing steps on the silicon substrate;
   wherein the performance of the first and second sequence of plasma processing steps reduces the surface roughness of the upstanding and/or recessed features while retaining the upstanding and/or recessed features;
   wherein the first sequence of plasma processing steps comprises i) a plasma deposition step using oxygen and at least one fluorocarbon gas at a total process pressure of 100 mTorr (13.3 Pa) or greater, with no RF bias or with an RF bias power of less than 100 W, followed by ii) a plasma etch step using oxygen, at least one fluorocarbon etchant gas, and $SF_6$ at a total process pressure of 100 mTorr (13.3 Pa) or greater, with no RF bias or with an RF bias power of less than 100 W; and
   wherein the second sequence of plasma processing steps comprises i) an isotropic plasma etch step using oxygen and at least one fluorine containing etchant gas at a total process pressure of 100 mTorr (13.3 Pa) or greater, with no RF bias or with an RF bias power of less than 100 W, followed by ii) a plasma etch step using at least one fluorine containing or chlorine containing etchant gas at a total process pressure of less than 100 mTorr (13.3 Pa), with an RF bias power of greater than 500 W.

2. The method according to claim 1, wherein the plasma deposition step i) and plasma etch step ii) of the first sequence of plasma processing steps are alternately repeated.

3. The method according to claim 1, wherein the plasma deposition step i) of the first sequence of plasma processing steps uses a flow rate of oxygen that is less than a flow rate of the at least one fluorocarbon gas.

4. The method according to claim 1, wherein in the plasma deposition step i) of the first sequence of plasma processing steps, the at least one fluorocarbon gas is $CF_4$.

5. The method according to claim 1, wherein in the plasma etch step ii) of the first sequence of plasma processing steps, the at least one fluorocarbon etchant gas comprises $CF_4$ and/or $C_4F_8$.

6. The method according to claim 5, wherein in the plasma etch step ii) of the first sequence of plasma processing steps uses a process gas mixture which consists essentially of oxygen, $SF_6$, $CF_4$ and $C_4F_8$.

7. The method according to claim 1, wherein the plasma etch step ii) of the first sequence of plasma processing steps uses flows of oxygen, $SF_6$ and the at least one fluorocarbon etchant gas, and a flow rate of oxygen is less than a combined flow rate of $SF_6$ and the at least one fluorocarbon etchant gas.

8. The method according to claim 1, wherein the plasma etch steps i) and ii) of the second sequence of plasma processing steps are alternately repeated.

9. The method according to claim 1, wherein in the plasma etch step i) of the second sequence of plasma processing steps, the fluorine containing etchant gas is $SF_6$.

10. The method according to claim 1, wherein in the plasma etch step i) of the second sequence of plasma processing steps, the fluorine containing etchant gas is $CF_4$.

11. The method according to claim 1, wherein in the plasma etch step ii) of the second sequence of plasma processing steps, $SF_6$ or $CF_4$ is used as the fluorine containing etchant gas.

12. The method according to claim 1, wherein the plasma etch step ii) of the second sequence of plasma processing steps uses a Noble gas.

13. The method according to claim 12, wherein the plasma etch step ii) of the second sequence of plasma processing steps uses a process gas mixture which consists essentially of $SF_6$ and argon.

14. The method according to claim 1, wherein the plasma etch step i) of the second sequence of plasma processing steps uses a flow rate of oxygen that is greater than a flow rate of the at least one fluorine containing etchant gas.

15. The method according to claim 1, wherein the plasma etch step ii) of the second sequence of plasma processing steps is performed in the substantial absence of oxygen.

16. The method according to claim 1, wherein one or more of the plasma etch step i) of the first sequence of plasma processing steps, the plasma etch step ii) of the first sequence of plasma processing steps, and the plasma etch step i) of the second sequence of plasma processing steps is performed at a total process pressure in a range 100 to 300 mTorr (13.3 to 40.0 Pa).

17. The method according to claim 1, wherein the plasma etch step ii) of the second sequence of plasma processing steps is performed at a total process pressure in a range 5 to 50 mTorr (0.67 to 6.7 Pa).

18. The method according to claim 1, wherein the upstanding and/or recessed features comprise one or more of microneedles, vias or trenches.

* * * * *